United States Patent [19]

Dangschat

[11] 4,438,345
[45] Mar. 20, 1984

[54] TRANSISTOR PULSE DRIVE CONTROL CIRCUIT

[75] Inventor: Rainer Dangschat, Landsham, Fed. Rep. of Germany

[73] Assignee: Siemens Aktiengesellschaft, Berlin and Munich, Fed. Rep. of Germany

[21] Appl. No.: 282,719

[22] Filed: Jul. 13, 1981

[30] Foreign Application Priority Data

Aug. 11, 1980 [DE] Fed. Rep. of Germany ....... 3030322

[51] Int. Cl.³ .......................... H03K 3/26; H03K 3/33
[52] U.S. Cl. .................................. 307/270; 307/254; 307/300
[58] Field of Search .............. 307/270, 300, 254, 255, 307/280

[56] References Cited

U.S. PATENT DOCUMENTS 4,287,436 9/1981 Tezuka et al. .................. 307/270
4,318,011 3/1982 Zeis ................................. 307/255

FOREIGN PATENT DOCUMENTS 52-2159 1/1977 Japan .............................. 307/253

OTHER PUBLICATIONS

Publication "Transistor-H-Ablenkschaltung und Sperrwandler Netzteil für 110°-Farbfernsehempfänger", by Rainer Danschat and Roman Haas.

Primary Examiner—Stanley D. Miller
Assistant Examiner—B. P. Davies
Attorney, Agent, or Firm—Herbert L. Lerner; Laurence A. Greenberg

[57] ABSTRACT

Electronic control circuit including an output transistor for furnishing the output current of the control circuit and having a control electrode being addressed by at least one control signal producing a time-variable current through the control electrode, including a programmed digital memory delivering pulses and generating the control signals for driving the control electrode of the output transistor, the pulses delivered by the memory being usable for direct and indirect control of the output transistor.

10 Claims, 5 Drawing Figures

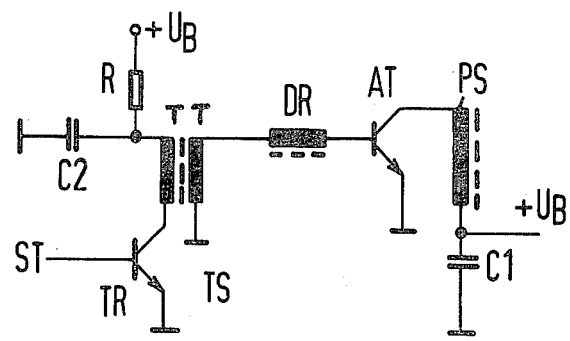
FIG 1
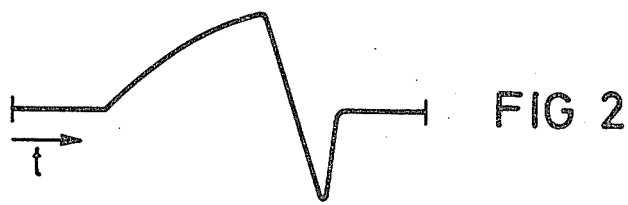
FIG 2
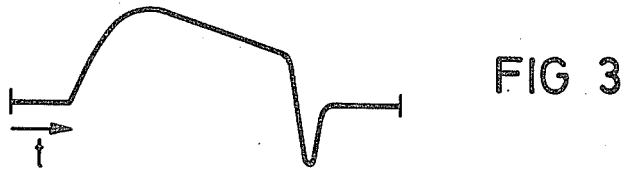
FIG 3

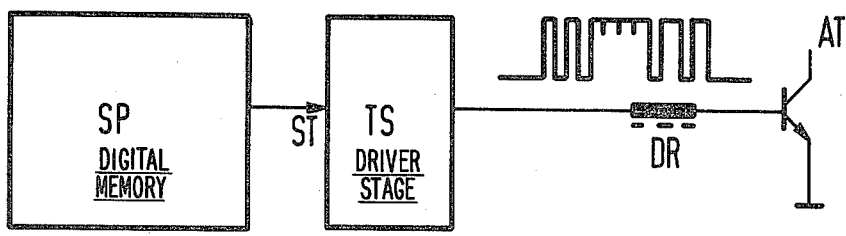
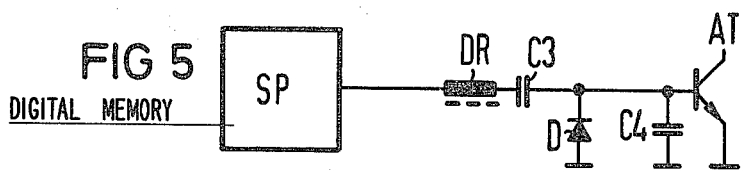

TRANSISTOR PULSE DRIVE CONTROL CIRCUIT

The invention relates to an electronic control circuit in which the control electrode of an output transistor furnishing the output current of the control circuit is addressed by at least one control signal bringing about a current which is variable in time through the control electrode.

The invention also relates in particular to an electronic control circuit for horizontal deflection in television sets, in which the control electrode of an output transistor furnishing the current causing the deflection is addressed during the individual deflection process by at least one control signal that brings about a base current which is variable in time.

In conventional control circuits of this type which will be more fully discussed hereinbelow, the output transistor is controlled through a driver stage, which includes a driver transistor followed by a driver transformer. The driver transistor itself is driven in the conventional device in such a way that the base current of the output transistor behaves in accordance with particular curves.

However, experience has shown that all these known measures require a relatively large amount of technical apparatus and cause power losses in the driver circuit which are in the range of 3 to 8 W in the conventional devices It is accordingly an object of the invention to provide an electronic control circuit which overcomes the hereinaforementioned disadvantages of the heretofore-known devices of this general type.

With the foregoing and other objects in view, there is provided, in accordance with the invention, an electronic control circuit including an output transistor for furnishing the output current of the control circuit and having a control electrode being addressed by at least one control signal producing a time-variable current through the control electrode, including a programmed digital memory, especially a semiconductor memory, delivering pulses and generating the control signals for driving the control electrode of the output transistor, the pulses delivered by the memory being usable for direct and/or indirect control of the output transistor.

Accordingly, the wave-shape of the base current is so-to-speak stored in the control circuit accordingly to the invention, in a semiconductor memory. In each of the individual deflection processes, the pulse pattern is read out of this memory, and fed to the base of the output transistor, such as through a driver stage. The pulse pattern can be adapted to the respective requirements without difficulties. The use of a programmable memory is advantageous since in that case the memory can be programmed in accordance with the prevailing requirement.

The width of the individual pulses is in the order of magnitude of 0.1 to 4 $\mu$s. A smoothing of the input current is automatically achieved because of the always present series inductance, which improves the switching-off of the transistor. In this way, at least in most cases, providing a digital-to-analog converter between the memory and the base of the output transistor is not necessary. The output transistor is then operated in the usual manner.

In accordance with another feature of the invention, the memory has an output, and there is provided a driver stage connected between the output of said memory and the control electrode of the output transistor. The driver stage itself can be operated with a driver transistor and a driver transformer in the manner customary heretofore. However, the driver transformer can also be replaced by a d-c coupling circuit. Therefore, in accordance with a further feature of the invention, there is provided a choke driving the control electrode of the output transistor.

In accordance with an added feature of the invention, there is provided a capacitor connected between said choke and the control electrode of the output transistor. This is of particular importance in the interest of low cost.

In accordance with an additional feature of the invention, the output transistor is a bipolar transistor for example of the npn type.

In accordance with again another feature of the invention, the output transistor is operated in a common emitter circuit and has a base electrode forming the control electrode.

In accordance with again a further feature of the invention, the output transistor has an electrode, especially the emitter, connected to reference potential, and including a diode having a cathode connected to the base of the output transistor and an anode connected to the electrode of the output transistor which is connected to reference potential or ground.

In accordance with a concomitant feature of the invention, the output transistor has a current-carrying electrode connected to reference potential or ground, and including a capacitor connected between the electrode connected to reference potential and the electrode of the output transistor.

Other features which are considered as characteristic for the invention are set forth in the appended claims.

Although the invention is illustrated and described herein as embodied in an electronic control circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the following drawings, in which:

FIG. 1 is a schematic circuit diagram of a prior art device for addressing an output;

FIGS. 2 and 3 are graphs showing the waveform of the base current of the output transistor which is desired for application of the control circuit in a horizontal deflection circuit; and FIGS. 4 and 5 are schematic and diagrammatic views of first and second respective circuit embodiments of the control circuit according to the invention.

Figure 4:

Referring now to the figures of the drawing and first, particularly, to FIGS. 1 to 3 thereof, it is seen that a conventional control circuit is shown in FIG. 1. In FIG. 1, the output transistor is controlled through a driver stage, which includes a driver transistor followed by a driver transformer. The driver transistor itself is driven in such a way that the base current of the output transistor behaves in accordance with the graphs shown in FIG. 2 or FIG. 3. In connection with this, the following will be noted first.

The transistor for the horizontal deflection in color television sets, i.e. an output transistor according to the description given above, is driven in customary circuits through a driver transformer with a base current of about 1A. This base current must have a certain waveform in order to obtain optimum switching conditions for the output transistor. This means, in particular, that the base current must ensure proper clean-up of the output transistor as well as a cutting off process that is simultaneously free of discontinuities and only tolerates losses that are as low as possible in the base circuit as well as in the collector circuit of the transistor. To achieve this objective, different approaches can be taken. In addition, the base current generated in the output transistor of the control circuit can have a rising trend toward the end of the forward sweep as can be seen in FIG. 2, or a falling trend as shown in FIG. 3. Accordingly, the cleaning-out time must be longer in the case of a base current characteristic according to FIG. 2 and shorter in case a base current characteristic according to FIG. 3 is used.

Depending on which compromise is desired in the construction of the line output stage, the waveform of the base current according to FIG. 2 or the waveform according to FIG. 3 may be optimum, or a waveform which is between the two characteristics shown in the two figures, may be desired. The desired waveform of the base current is achieved in the conventional control circuits for horizontal deflection by appropriate construction of the driver transformer or by R-C networks connected parallel thereto, which may be arranged either on the primary side or on the secondary side of this driver transformer, or by inductances, resistors or diodes which act on the base of the output transistor.

Experience has shown that all these known measures require a relatively large amount of technical means and cause power losses in the driver circuit which, in the conventional devices, are in the range of 3 to 8 W.

In the control circuit according to the state of the art shown in FIG. 1, the output transistor AT is connected at its base to the secondary side of the driver transformer TT of a driver stage TS through a choke DR. The output of the output transistor, constructed in the case of the example shown as an pnp transistor that furnishes the deflection current, is represented by the emitter and the collector of the transistor AT. The emitter is connected to reference potential (ground) and the collector is connected through a primary coil PS of the deflection transformer to the first supply potential $+U_B$. In addition, the terminal of the primary coil PS connected to the first supply potential is connected to the reference potential through a capacitor C1.

One terminal of the primary winding of the driver transformer TT is connected through a resistor R to the first supply potential, and at the same time it is connected through a capacitor C2, to ground. The other terminal of the primary side of the driver transformer TT is connected to the collector of the driver transistor TR which is likewise an npn transistor. The emitter of the driver transistor TR is connected to reference potential, while its base forms the control input ST of the driver stage TS. The control input ST of the driver stage TS is driven in such a way that the resulting base current has, for instance, the behavior seen in FIG. 2, or that seen in FIG. 3.

In the example of the conventional control circuit shown in FIG. 1, the base electrode is used as the control electrode. However, the control electrode can be also represented by the emitter electrode of the transistor AT. An applicable example is described in the publication "Siemens-Bauteile-Informationen" 9 (1971), (Siemens Component Information) No. 5, pages 135 to 140.

According to the invention as illustrated in FIGS. 4 and 5, the known control circuit shown in FIG. 1 for horizontal deflection is supplemented by a digital memory SP, the information output of which is provided for driving the control input ST of the driver stage TS. The digital memory SP is preferably provided as a semiconductor memory and can, for instance, be monolithically combined with a transistor TA of the driver stage TS. It is understood that the memory SP can be provided in the form of a read-only memory (ROM) as well as a programmable memory. The binary program present in the memory SP is such that through interaction of the driver stage TS and the choke DR, the desired waveform of the base current for the output transistor AT is obtained by these delivered pulses when the memory SP is read out.

In order to simplify the driver stage TS, the driver transformer TT can be omitted and the collector of the driver transistor TR can be connected directly to the input of the choke DR as well as to the circuit point between the resistor R and the capacitor C2. Finally, the output of the digital memory SP can be connected through the choke DR to one terminal of the capacitor C3, the other terminal of the capacitor C3 forming the connection to the base of the output transistor AT, thus omitting the driver stage Ts altogether as is seen in FIG. 5.

In the case of the illustrated embodiment example, the transistors used, particularly the output transistor AT, are chosen as bipolar transistors. It should also be mentioned here that the use of pnp transistors as well as field effect transistors, particularly of the MOS type, is possible. It is furthermore not mandatory to operate the output transistor AT in a common emitter circuit as in the examples shown and described.

The memory SP can be constructed in such a way that it supplies the signals required for controlling the output transistor AT as discrete binary pulses throughout, which is probably the case in most instances. However, it can also be constructed in such a way that the incoming control pulses appear in a so-called biphase code. Finally, addressing the output transistor with the digital memory SP through an analog-to-digital converter may be advisable, although in practice, these costs will probably be saved as far as possible.

At least in the absence of a driver stage TS with the driver transistor TR, it is advisable if the control electrode of the output transistor AT is connected to the electrode of this transistor which is at reference potential. For instance, in the example according to FIG. 5, the connection is made from the control electrode of the transistor AT to the emitter electrode through a diode D poled in the reverse direction and a capacitor C4, in order to ensure the mean d-c value of the control current.

Besides the application of the control circuit according to the invention for horizontal deflection of color television receivers, there are still other possibilities for using this circuit; thus, it can also be used, for instance, for driving a switching power supply, such as a blocking oscillator power supply as is likewise used for television purposes.

There are claimed:

1. Electronic control circuit for the horizontal deflection of a television set and for controlling a switched circuit element, including an output transistor for furnishing the output current of the control circuit and having a control electrode being addressed by at least one control signal producing a time-variable current through the control electrode, comprising a programmed digital memory delivering a series of pulses and generating the control signals for driving the control electrode of the output transistor, and a choke connected between said memory and the control electrode of the output transistor for carrying the control signals to the output transistor, said memory being binary programmed in such a manner that the control signals are formed from the series of pulses delivered by said memory and by said choke with a waveform required for controlling the output transistor without the use of a digital to analog converter.

2. Control circuit according to claim 1, wherein said memory has an output, and including a driver stage connected between the output of said memory and said choke for feeding the control signals to the control electrode of the output transistor.

3. Control circuit according to claim 1 or 2, including a capacitor connected between said choke and the control electrode of the output transistor.

4. Control circuit according to claim 1, wherein the output transistor is a bipolar transistor.

5. Control circuit according to claim 4, wherein the output transistor is operated in a common-emitter circuit and has a base electrode forming the control electrode.

6. Control circuit according to claim 4 or 5, wherein the output transistor has an electrode connected to reference potential, and including a diode having a cathode connected to the base of the output transistor and an anode connected to the electrode of the output transistor which is connected to reference potential.

7. Control circuit according to claim 6, including a capacitor connected between the control electrode and the electrode connected to reference potential of the output transistor.

8. Control circuit according to claim 1, wherein the output transistor has a current-carrying electrode connected to reference potential, and including a capacitor connected between the electrode connected to reference potential and the control electrode of the output transistor.

9. Control circuit according to claim 4, wherein the output transistor is an npn bipolar transistor.

10. In an electronic control circuit for the horizontal deflection of a television set and for controlling a switched circuit element, including an output transistor for furnishing the output current of the control circuit and having a control electrode being addressed by at least one control signal producing a time-variable current through the control electrode, the improvement comprising means connected to the control electrode of the output transistor for delivering a series of pulses and for generating the control signals from the series of pulses for driving the control electrode of the output transistor with a waveform required for controlling the output transistor without the use of a digital-to-analog converter, said pulse delivering and control signal generating means being in the form of a binary programmed digital memory and a choke connected between said memory and the control electrode of the output transistor.

* * * * *